(12) United States Patent
Kusunoki et al.

(10) Patent No.: US 7,495,261 B2
(45) Date of Patent: Feb. 24, 2009

(54) GROUP III NITRIDE SEMICONDUCTOR LIGHT-EMITTING DEVICE AND METHOD OF PRODUCING THE SAME

(75) Inventors: Katsuki Kusunoki, Ichihara (JP); Kazuhiro Mitani, Ichihara (JP); Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 51 days.

(21) Appl. No.: 10/593,080

(22) PCT Filed: Mar. 17, 2005

(86) PCT No.: PCT/JP2005/005448

§ 371 (c)(1),
(2), (4) Date: Jan. 23, 2007

(87) PCT Pub. No.: WO2005/091391

PCT Pub. Date: Sep. 29, 2005

(65) Prior Publication Data

US 2007/0278509 A1    Dec. 6, 2007

Related U.S. Application Data

(60) Provisional application No. 60/557,063, filed on Mar. 29, 2004.

(30) Foreign Application Priority Data

Mar. 18, 2004    (JP) .............................. 2004-078819

(51) Int. Cl.
*H01L 29/22*    (2006.01)
*H01L 33/00*    (2006.01)
*H01L 29/221*    (2006.01)
*H01L 29/225*    (2006.01)

(52) U.S. Cl. .............................. 257/94; 257/96; 257/97; 257/103; 257/E33.003; 257/E33.025

(58) Field of Classification Search ................... 257/94, 257/96, 97, 103, E33.003, E33.025
See application file for complete search history.

(56) References Cited

U.S. PATENT DOCUMENTS 7,112,826 B2 *    9/2006    Motoki et al. ............... 257/103

(Continued)

FOREIGN PATENT DOCUMENTS

JP    55-3834    1/1980

(Continued)

OTHER PUBLICATIONS

J.A. Duffy; "General Inorganic Chemistry"; Hirokawa Publishing Co., Ltd.; First Edition Published Apr. 1, 1967; pp. 247-249, partial translation.

*Primary Examiner*—Ngan Ngo
(74) *Attorney, Agent, or Firm*—Sughrue Mion, PLLC (57) ABSTRACT

A Group III nitride semiconductor light-emitting device includes a stacked structure 11 formed on a crystal substrate (100) to be removed from it and including two Group III nitride semiconductor layers 104 and 106 having different electric conductive types and a light-emitting layer 105 which is stacked between the two Group III nitride semiconductor layers and which includes a Group III nitride semiconductor, and a plate body 111 made of material different from that of the crystal substrate and formed on a surface of an uppermost layer which is opposite from the crystal substrate that is removed from the stacked structure.

8 Claims, 3 Drawing Sheets

U.S. PATENT DOCUMENTS

2004/0072383 A1   4/2004   Nagahama et al.

FOREIGN PATENT DOCUMENTS

| JP | 6-302857 A | 10/1994 |
| JP | 11-220167 A | 8/1999 |
| JP | 2002-198569 A | 7/2002 |
| JP | 2002-261024 A | 9/2002 |
| JP | 2003-243302 | 8/2003 |
| JP | 2003-309289 A | 10/2003 |
| WO | WO 03/034508 A1 | 4/2003 |

* cited by examiner

GROUP III NITRIDE SEMICONDUCTOR LIGHT-EMITTING DEVICE AND METHOD OF PRODUCING THE SAME

CROSS REFERENCE TO RELATED APPLICATIONS

This application is an application filed under 35 U.S.C. § 111(a) claiming the benefit pursuant to 35 U.S.C. § 119(e)(1) of the filing date of Provisional Application No. 60/557,063 filed Mar. 29, 2004 pursuant to 35 U.S.C § 111(b).

TECHNICAL FIELD

The present invention relates to a Group III nitride semiconductor light-emitting device comprising a stacked structure including two Group III nitride semiconductor layers having different electric conductive types and a light-emitting layer which is stacked between the two Group III nitride semiconductor layers and which comprises a Group III nitride semiconductor, and to a producing method thereof.

BACKGROUND ART

Conventionally, Group III nitride semiconductor light-emitting devices, such as light-emitting diodes (LEDs) which emit short-wavelength light of blue band or green band and laser diodes (LDs), utilize a light-emitting layer of gallium indium nitride ($Ga_YIn_ZN$: $0 \leq Y$, $Z \leq 1$, $Y+Z=1$) (JP-B SHOO 55-3834, for example). A light-emitting portion is formed such that two clad layers made of Group III nitride semiconductors having different electric conductive types are disposed on both sides, respectively, of the light-emitting layer. The clad layer for forming the light-emitting portion of such a double hetero (DH) structure is made of aluminum gallium nitride ($Al_XGa_YN$: $0 \leq X$, $Y \leq 1$, $X+Y=1$).

The stacked structure for forming the Group III nitride semiconductor light-emitting device of pn junction type DH structure that has a light-emitting portion of DH structure having such a light-emitting layer between an n-type clad layer and a p-type clad layer is formed using mainly sapphire ($\alpha$-$Al_2O_3$ monocrystal) or silicon carbide (SiC) monocrystal as a substrate. This is because such material has optical transparency allowing light from the light-emitting layer to pass and has heat resistance capable of withstanding crystal growth of the Group III nitride semiconductor layer which requires high temperature. In the case of the conventional Group III nitride semiconductor light-emitting device, the substrate used for forming the stacked structure for the light-emitting device is generally left standing as a plate body for mechanically supporting the stacked structure even after the device forming step.

The Group III nitride semiconductor light-emitting device with the substrate made of crystal, such as sapphire, remaining thereof is suitable for maintaining the mechanical supporting force for the stacked structure, but since the sapphire is electrically insulative, the device must be processed into a flip chip type or two-bonding type. In the case of the flip chip type, it is troublesome to process the device, and in the case of the two-bonding type, the wiring including wire bonding is troublesome. Thus, there is a problem that the productivity at the time of mounting operation is deteriorated.

The present invention has been accomplished in view of the above circumstances, and it is an object of the invention to provide a Group III nitride semiconductor light-emitting device in which the productivity at the time of mounting operation is excellent while maintaining a mechanical supporting force of a substrate. It is also an object of the invention to provide a method of producing the Group III nitride semiconductor light-emitting device and an LED lamp.

DISCLOSURE OF THE INVENTION

To achieve the above object, the present invention provides a Group III nitride semiconductor light-emitting device comprising a stacked structure formed on a crystal substrate to be removed from it and including two Group III nitride semiconductor layers having different electric conductive types and a light-emitting layer which is stacked between the two Group III nitride semiconductor layers and which comprises a Group III nitride semiconductor, and a plate body made of material different from that of the crystal substrate and formed on a surface of an uppermost layer which is opposite from the crystal substrate that is removed from the stacked structure.

In the Group III nitride semiconductor light-emitting device, the plate body is made of conductive material.

In the first or second mentioned Group III nitride semiconductor light-emitting device, the crystal substrate is removed from the stacked structure by irradiating laser beams onto a junction interface region between the stacked structure and the crystal substrate.

Any one of the first to third mentioned Group III nitride semiconductor light-emitting devices further comprises an ohmic electrode provided on the plate body.

In any one of the first to fourth mentioned Group III nitride semiconductor light-emitting devices, the plate body is formed on the surface of the uppermost layer through a metal layer.

In the fifth mentioned Group III nitride semiconductor light-emitting device, the metal layer comprises eutectic metal film.

Any one of the first to sixth mentioned Group III nitride semiconductor light-emitting devices further comprises a metal reflection film for reflecting light from the light-emitting layer provided between the plate body and the surface of the uppermost layer.

In any one of the first to seventh mentioned Group III nitride semiconductor light-emitting device, the crystal substrate is a sapphire substrate having a (0001) face on which the stacked structure is formed, and the plate body is a conductive (001)-Si monocrystal.

In the eighth mentioned Group III nitride semiconductor light-emitting device, the plate body has a <110> crystal orientation that is in parallel to a [1.1.-2.0] crystal orientation of the (0001)-sapphire substrate.

The present invention also provides a method of producing a Group III nitride semiconductor light-emitting device comprising the steps of forming on a crystal substrate to be removed a stacked structure including two Group III nitride semiconductor layers having different electric conductive types and a light-emitting layer which is stacked between the two Group III nitride semiconductor layers and which comprises a Group III nitride semiconductor, forming a plate body made of material different from that of the crystal substrate on a surface of an uppermost layer which is opposite from the crystal substrate, and removing the crystal substrate.

The present invention also provides an LED lamp having any one of the first to ninth mentioned Group III nitride semiconductor light-emitting devices.

According to the present invention, on a surface of an uppermost layer which is opposite from a crystal substrate used for forming the stacked structure thereon, there is provided a plate body made of material different from that of the crystal substrate, and the crystal substrate is then removed. Thus, the stacked structure is mechanically supported on the plate body, and the ohmic electrode having one polarity is formed on the surface of the conductive plate body. Therefore, the device can directly be mounted, and only an ohmic electrode having the opposite polarity may be subjected to wire bonding and thus, the productivity at the time of the mounting operation is enhanced.

According to the invention, the conductive Si monocrystal plate is bonded onto the stacked structure used for the light-emitting device so that the monocrystal plate is disposed in parallel to the specific crystal orientation of the sapphire substrate used for forming the stacked structure, thereby forming the Group III nitride semiconductor light-emitting device. Therefore, even if the great forward current should flow over a long time, no crack which might be caused due to thermal stress is generated in the stacked structure. This is why since the warping direction extends along the crystal orientation when the thermal stress is decreased, if the monocrystal plate is bonded onto the opposite side from a side where it is conceived that the plate is warped, the plate is not warped. Since the thermal conductivity is excellent, radiation properties are also excellent. As a result, even if the device is lit for a long time, thermal damage is less prone to be generated, and when high current flows, output is not lowered by heat.

BEST MODE FOR CARRYING OUT THE INVENTION

An embodiment of the present invention will be described in detail.

A Group III nitride semiconductor light-emitting device of the present invention comprises a stacked structure on a crystal substrate for use in a light-emitting device having (a) a first Group III nitride semiconductor layer of a first conductive type, (b) a second Group III nitride semiconductor layer of a second conductive type and (c) a light-emitting layer made of a Group III nitride semiconductor and sandwiched between the first and second Group III nitride semiconductors. The first and second Group III nitride semiconductor layers have functions as a clad layer or a contact layer.

Examples of material of the crystal substrate for forming the stacked structure thereon are monocrystal oxide, such as sapphire and lithium gallium oxide ($LiGaO_2$), and Group III nitride semiconductor monocrystal, such as 3C crystal type cubic monocrystal silicon carbide (3C-SiC), 4H or 6H crystal type hexagonal monocrystal SiC (4H-SiC, 6H-Sic), silicon (Si) monocrystal, gallium phosphide (GaP), gallium arsenide (GaAs).

When the first Group III nitride semiconductor layer forming the stacked structure is provided on a crystal substrate having no relation to lattice matching, a buffer layer for moderating lattice mismatch is provided. When the GaN-based first Group III nitride semiconductor layer is allowed to grow on the sapphire substrate, for example, the first Group III nitride semiconductor layer is stacked on the substrate surface through a GaN buffer layer provided by a seeding process (SP) technique (JP-A 2003-243302). It is also effective for moderating the lattice mismatch with respect to a substrate even if a low temperature buffer layer is made of AlN instead of GaN. When the buffer layer is made of AlN, the layer thickness of the low temperature buffer layer is in the range of 1 nm or more and 100 nm or less, preferably in the range of 2 nm or more and 50 nm or less, and more preferably in the range of 2 nm or more and 5 nm or less.

It is preferable that the surface of the low temperature buffer layer is flat rather than finely uneven. For example, it is suitable that the surface roughness is 0.10 μm or less, more preferably 0.05 μm or less, in terms of Ra. A low temperature buffer layer having a surface of such small roughness can be obtained by providing a monocrystal layer at a boundary with respect to the crystal substrate at the time of growth at low temperature of 350° C. to 450° C., for example. The surface roughness can be obtained using a measuring device, such as an atomic force microscope (AFM). The low temperature buffer layer having a flat surface of small roughness is advantageous for stacking an upper layer having excellent surface flatness. For example, a base layer having a smooth and flat surface and having no uneven portion can grow on the surface of a GaN low temperature buffer layer having small roughness.

A base layer having a flat surface, e.g. a GaN layer provided on a buffer layer contributes to providing a first or second electric conductive type Group III nitride semiconductor layer having flat surface. If the first Group III nitride semiconductor layer is an n-type layer, the second Group III nitride semiconductor layer is a p-type layer of opposite electric conductive type. The layer thickness of the base layer which is advantageous for providing the first and second Group III nitride semiconductor layers having flat surfaces is 0.5 μm or more and 5 μm or less, preferably 1 μm or more and 3 μm or less, in the case of a GaN layer. The first or second Group III nitride semiconductor layer having flat surface can be utilized as an n-type or p-type clad layer which is suitable for stacking a quantum well structure made of an excellently flat and extremely thin well layer. Further, it can be utilized as an n-type or p-type contact layer which is suitable for forming input and output electrodes having excellent adhesion.

An undoped layer to which impurities are not intentionally added can be utilized as the first and second Group III nitride semiconductor layers. The n-type or p-type Group III nitride semiconductor layer intentionally doped with impurities to control electric conduction, carrier concentration and resistance value can also be utilized. First and second Group III nitride semiconductor layers doped with n-type or p-type impurities so that the atom concentration in the layer becomes $1 \times 10^{18}$ $cm^{-3}$ or more and $5 \times 10^{19}$ $cm^{-3}$ or less are suitable for forming a clad layer used for obtaining a light-emitting device having a low forward voltage and high reliability in terms of operation. It is necessary that the first and second Group III nitride semiconductor layers used as the clad layer are made of material having band gap greater than that of the material of the light-emitting layer, but it is unnecessary that the Group III nitride semiconductor layers are made of the same material. For example, an n-type clad layer may be made of n-type $Ga_YIn_ZN$ ($0 \leq Y, Z \leq 1, Y+Z=1$), and a p-type clad layer may be made of p-type $Al_XGa_YN$ ($0 \leq X, Y \leq 1, X+Y=1$), for example. If the first or second electric conductive type clad layers made of different Group III nitride semiconductor material are utilized, asymmetric light-emitting portions in terms of band structure can be formed.

The first and second Group III nitride semiconductor layers having high concentration impurities in the above atom concentration range and having low resistance are effective as contact layers. A Group III nitride semiconductor layer of low resistance in which carrier concentration is $1 \times 10^{18}$ cm$^{-3}$ or more is especially advantageous for forming an ohmic electrode of low contact resistance. Examples of n-type impurities which can be utilized for obtaining a low resistant n-type Group III nitride semiconductor layer are Group IV elements, such as silicon (Si) and germanium (Ge) and Group VI elements, such as selenium (Se). Examples of p-type impurities are Group II elements, such as magnesium (Mg) and beryllium (Be). It is preferable that the thickness of the contact layer is equal to or greater than such a depth that allows the material constituting the ohmic electrode to be dispersed in and enter it. When an ohmic electrode is formed by alloying heat-treatment, the thickness is equal to or greater than the depth of alloy front. Suitable thickness is 10 nm or more.

A light-emitting layer provided between the first and second Group III nitride semiconductor layers is made of gallium indium nitride ($Ga_YIn_ZN$: $0 \leq Y$, $Z \leq 1$, $Y+Z=1$), gallium nitrogen phosphide ($GaN_{1-a}P_a$: $0 \leq a<1$) or $Al_XGa_YIn_ZN_{1-a}M_a$ ($0 \leq X$, $Y$, $Z \leq 1$, $X+Y+Z=1$, M represents a Group V element other than nitrogen, $0 \leq a<1$) The light-emitting layer may be made of a single quantum well (SQW) layer or a multi-quantum well (MQW) structure. When the well layer of the quantum well structure is made of $Ga_YIn_ZN$, the indium composition ratio (=Z) is adjusted in view of a desired emission wavelength and set greater in accordance as the wavelength of light is longer. The entire thickness of the light-emitting layer of the multi-quantum well structure having a well layer of $Ga_YIn_ZN$ is preferably 100 nm or more and 500 nm or less.

The quantum well structure of the light-emitting layer can be formed by forming a layer to be bonded to the first or second Group III nitride semiconductor layer as a barrier layer or a well layer. The starting end layer (lowermost layer) of the quantum well structure may be either a barrier layer or a well layer. Similarly, the terminal end layer (uppermost layer) of the quantum well structure may be either a barrier layer or a well layer. There is no problem even if compositions of the starting end layer and the terminal end layer are different. A quantum well structure comprising a well layer having excellent crystallinity because of being undoped and a barrier layer doped with impurities can avoid an adverse affect caused by the piezo effect and can contribute to giving rise to a Group III nitride semiconductor light-emitting device having excellent strength and stable emission wavelength. The well layer and the barrier layer can be made of thin film such as of $GaN_{1-a}P_a$ ($0 \leq a<1$) or $Al_XGa_YIn_ZN_{1-a}M_a$ ($0 \leq X$, $Y$, $Z \leq 1$, $X+Y+z=1$, M represents a Group V element other than nitrogen, $0 \leq a<1$) as well as $Ga_YIn_ZN$ ($0 \leq Y$, $Z \leq 1$, $Y+Z=1$).

The Group III nitride semiconductor layers constituting the stacked structure can grow by vapor phase growing means, such as metal-organic chemical vapor deposition (MOCVD), vapor phase epitaxy (VPE) and molecular beam epitaxy (MBE). In order to obtain a layer of a wide range of film thickness on order of from some nm of the thickness of a well layer of quantum well structure light-emitting layer to μm suitable for the thickness of the first or second Group III nitride semiconductor layer, the MOCVD means or MBE means is suitable. Among them, the MOVPE means is suitable for vapor deposition of a Group III nitride semiconductor layer containing arsenic (AS) and phosphorus (P) exhibiting high volatility other than nitrogen. The MOCVD means under normal pressure (substantially atmospheric pressure) or of reduced pressure system can be utilized.

In the present invention, since the crystal substrate used for forming the stacked structure for the light-emitting device is removed, it is unnecessary to use optically transparent crystal as a substrate. Since it is rather necessary to remove originally existing substrate (crystal substrate used for forming the stacked structure), it is preferable that a substrate is made of crystal that can readily be lifted off with ease by etching means, such as wet etching or dry etching including high frequency plasma etching, or laser radiation means. What is advantageous for exfoliation by the laser radiation means is a crystal substrate having coefficient of thermal expansion which is clearly different from that of the structure layer of the stacked structure.

In the present invention, after the originally existing crystal substrate is removed, a plate body having mechanical strength is bonded onto the uppermost layer of the stacked structure so as to reinforce reduction of the mechanical supporting force for the stacked structure. An example of the plate body to be bonded is an Si monocrystal plate. Further, SiC, GaP and GaAs monocrystal plates, amorphous glass, metal plate and the like may be bonded. The conductive plate body is effective for forming the Group III nitride semiconductor light-emitting device of the present invention. The plate body is not limited to the conductive monocrystal plate insofar as it has excellent conductivity. Materials suitable to be bonded are copper oxide (CuO; the composition ratio of copper atom and oxygen atom is not always 1:1), zinc oxide (ZnO; the composition ratio of zinc atom and oxygen atom is not always 1:1), crystal oxide, such as composite oxide of indium and tin (ITO), metal plate, such as of molybdenum (Mo), aluminum (Al). Metal which reflects light is suitable as the plate to be bonded. A printed board on which wiring pattern is formed can also be bonded.

If the surface of the stacked structure to be bonded or the surface of the plate body to be bonded onto the stacked structure is coated in advance with metal film, the stacked structure and the plate body can easily be bonded to each other. Use of a metal thin film of platinum (Pt), nickel (Ni), gold (Au), rhodium (Rh), palladium (Pd) and molybdenum (Mo) facilitates bonding of the two. In order to strongly bond the conductive plate body of silicon (Si) monocrystal and the Group III nitride semiconductor layer, metal thin film of Au and Ni is particularly suitable. The suitable thickness of the metal thin film is generally 0.1 μm or more and 2 μm or less. The metal film is provided on one or both of the surfaces of the plate body and the stacked structure to be bonded. When they are to be bonded, they are pressurized under external pressure of 1 kg/cm$^2$ to 5 kg/cm$^2$ or heated to high temperature of 500° C. to 1000° C., and this makes the bonding operation easy.

If the eutectic metal film is used, they can be bonded easily. Examples of the eutectic metal film are soldering eutectic alloy, such as alloy of gold and tin (Au—Sn), alloy of gold and silicon (Au—Si), alloy of gold and indium (Au—In), alloy of gold and gallium (Au—Ga). Another example is alloy film including tin (Sn), platinum (Pt), nickel (Ni), chromium (Cr), copper (Cu), iron (Fe), cobalt (Co). If the eutectic metal film is used, bonding can be carried out at relative low temperature of 300° C. to 500° C. and this is convenient. When the heating temperature is set higher at the time of bonding, the pressure applied from the outside can be set lower. If the heating temperature is set lower, however, it is necessary to set the external pressure higher.

A metal paste containing metal fine powder can be used for bonding instead of coating the metal film. For example, platinum (Pt) paste, silver-palladium (Ag—Pd) paste can be cited. For example, bonding is attained through the steps of applying paste to the entire back surface of the plate body, placing the plate body on the surface of the stacked structure and applying pressure to the two. Then, they are heated in a vacuum environment while maintaining the bonded state, thereby completing the bonding operation. When the paste is used as bonding material, if bubbles contained in the paste are removed in the vacuum environment, they can be bonded with fine film having few gaps therein.

If a metal reflection film capable of reflecting light from the light-emitting layer is inserted into the metal film used for efficiently bonding the stacked structure and the plate body, this is effective in obtaining a Group III nitride semiconductor light-emitting device having excellent emission strength. The metal reflection film can be made of six metal elements of the platinum group, such as iridium (Ir), rhodium (Rh) and platinum (Pt) ("Duffy Mukikagaku", Hirokawa Shoten Co. Ltd., issued on Apr. 15, 1971, fifth edition, p. 249). Other materials are metal films having excellent reflection coefficient with respect to light from the light-emitting layer, such as of chromium (Cr), hafnium (Hf), silver (Ag) and aluminum (Al). To improve the adhesion between the metal film and the metal reflection film for bonding, a barrier layer for preventing dispersion of metal therebetween may be provided. Such a barrier layer may be made of high melting point metal, such as titanium (Ti), tungsten (W), tantalum (Ta) and chromium (Cr).

The metal film, eutectic metal film, metal reflection film and barrier layer for bonding can be formed by general high frequency sputtering means, resistant heating vacuum deposition means, electron beam (EB) vacuum deposition means and the like. A metal film composed of metal paste diluted with an appropriate solvent can be formed by painting means. When a metal film is formed through application of metal paste, the film thickness thereof is adjusted by controlling the application amount or the number of rotation of a sample when the paste is applied.

If the plate body to be bonded is a semiconductor material having excellent conductivity, the plate body can be provided with an ohmic electrode. When the plate body to be bonded is an n-type or p-type conductive Si monocrystal plate, for example, the ohmic electrode can easily be formed from gold (Au) or aluminum (Al). A plate body which is previously provided at its one surface with an ohmic electrode may be bonded onto the stacked structure. The plate body to be bonded may be ground or etched to reduce its thickness, and the ohmic electrode may be provided on the thinned surface. It is preferable that the plate body is thinned to such a degree that the device is prevented from falling in the subsequent wire bonding or mounting. The thinned plate body has such a thickness that the device driving current supplied from the ohmic electrode can sufficiently be dispersed two-dimensionally. If the plate body to be bonded is an Si monocrystal plate, it can easily be thinned by polishing or etching. The Si monocrystal plate can be polished using polishing powder mainly comprising silica or alumina powder. If nitric acid ($HNO_3$) or hydrofluoric acid fluoride (HF) is used, the plate body can be etched until a desired film thickness can be obtained.

When the Group III nitride semiconductor light-emitting device of the present invention is formed by bonding an Si monocrystal plate on the uppermost surface of the stacked structure, with sapphire used as a substrate, the Si monocrystal plate is bonded so that the <110> crystal orientation thereof is substantially in parallel to the [1.1.-2.0.] crystal orientation of the sapphire. This is because distortion can be prevented from generating when they are bonded since the lattice plane distances of both the crystals are similar. The orientation of the Group III nitride semiconductor layer disposed on the sapphire is oriented along a certain crystal orientation of the sapphire. Usually, the crystal orientation of sapphire and that of the Group III nitride semiconductor layer are in agreement with each other. Thus, the same effect can be obtained even if the Si monocrystal plate is bonded so that the <110> crystal orientation of the Si monocrystal and the [1.1.-2.0.] crystal orientation of the Group III nitride semiconductor layer on the sapphire are substantially in parallel to each other.

To remove the substrate used for forming the stacked structure, polishing means or lifting-off means can be used. For example, the sapphire substrate can be polished using polishing powder composed mainly of silica, alumina or diamond powder.

To lift off the crystal substrate used for forming the stacked structure from the stacked structure, laser radiation means is suitable. As laser beams suitable for radiation for lifting off the substrate, it is possible to use pulsed laser beams, carbon dioxide gas ($CO_2$) laser beams, excimer laser beams and the like. Of these, excimer laser beams using argon fluoride (ArF), krypton fluoride (KrF) or the like as the excitation gas are especially preferred. It is preferable that the wavelength of the laser beams is 193 nm or 248 nm. When the crystal substrate is to be lifted off by laser beams, if the thickness of the crystal substrate is thick, since the laser beams are liable to be absorbed, a region to be lifted off cannot be heated effectively. Therefore, in order to effectively lift the crystal substrate off the stacked structure through irradiation with laser beams, it is preferable that the thickness of the crystal substrate is 300 µm or less. When the surface of the crystal substrate is uneven or has a slight flaw, since the absorption of laser beams is varied, the crystal substrate is apt to be lifted off unevenly.

As described above, in the embodiment of the present invention, on the surface of an uppermost layer which is opposite from the crystal substrate used for providing the stacked structure, there is provided a plate body made of material different from that of the crystal substrate, and the crystal substrate is then removed. Thus, the plate body can mechanically support the stacked structure. Also, since the ohmic electrode having one polarity is formed on the surface of the conductive plate body, the device can directly be mounted, and since only an ohmic electrode having the opposite polarity may be subjected to wire bonding, the productivity at the time of the mounting operation is enhanced.

Further, the conductive Si monocrystal plate is bonded onto the stacked structure for forming the light-emitting device so that the monocrystal plate is in parallel to the specific crystal orientation of the sapphire substrate used for forming the stacked structure, thereby forming the Group III nitride semiconductor light-emitting device. Therefore, even if the great forward current should flow over a long time, no crack which might be caused due to thermal stress is generated in the stacked structure. Since the thermal conductivity is excellent, radiation properties are also excellent.

Although the crystal substrate used for forming the stacked structure is completely removed in the manner as described above, it is not always necessary to completely remove the crystal substrate, and the crystal substrate may be thinned rather than removed.

If the crystal substrate used for forming the stacked structure is thinned, it is possible to obtain a Group III nitride semiconductor light-emitting device in which absorption of light passing through the crystal substrate can be reduced, light can easily be taken out to the outside, and electrostatic blocking voltage is excellent. To obtain it, it is preferable that n-type or p-type conductive monocrystal that is optically transparent is used as the substrate. The crystal substrate to be left standing has both a function for mechanically supporting the stacked structure and a function for permitting light from the light-emitting layer to pass. If the crystal substrate to be left standing is increasingly thinned, the transmittance of light is increased, and this is preferable for obtaining a Group III nitride semiconductor light-emitting device having excellent light taking-out efficiency. If the crystal substrate is thinned, however, the function of the crystal substrate for supporting the stacked structure is reduced. Thus, it is preferable that the thickness of the crystal substrate to be left standing is 100 μm to 300 μm for maintaining both the functions.

EXAMPLES

The present invention will be described based on a case in which a conductive Si monocrystal plate is bonded as a plate body onto the uppermost layer of a stacked structure to form a Group III nitride semiconductor light-emitting device.

Figure 1:
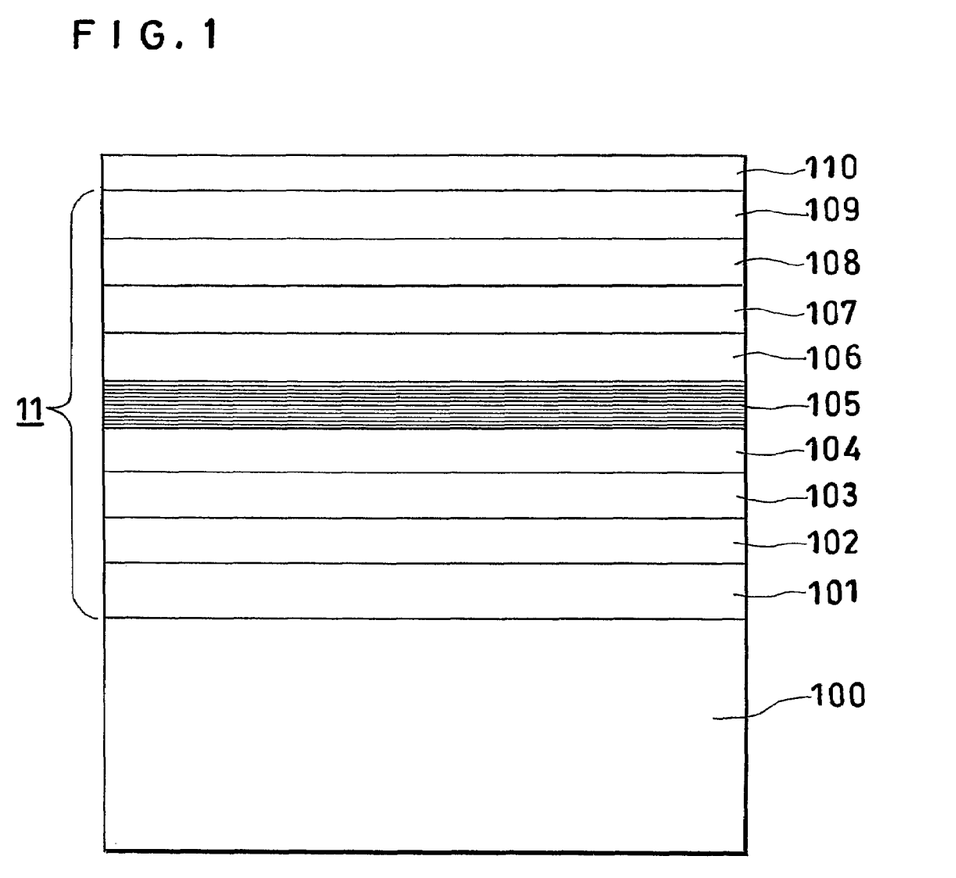
FIG. 1 is a schematic cross section showing the structure of a stacked structure formed on a sapphire substrate.
Figure 2:
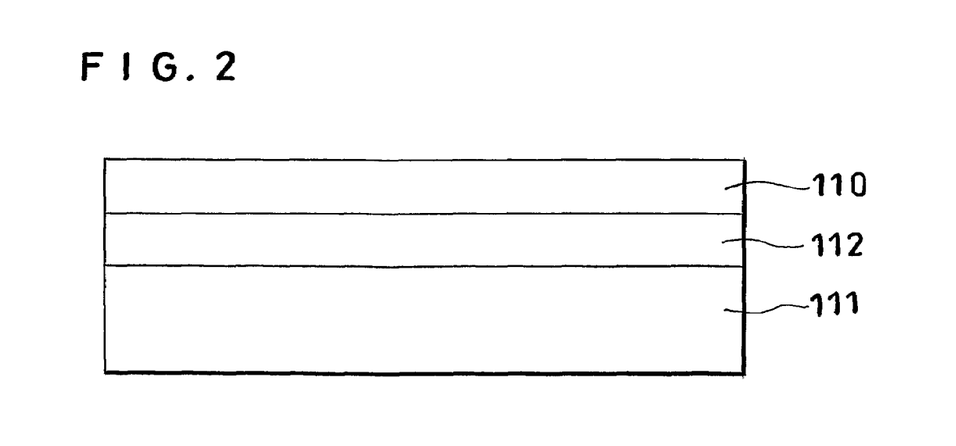
FIG. 2 shows a structure on the side of a plate body.
Figure 3:
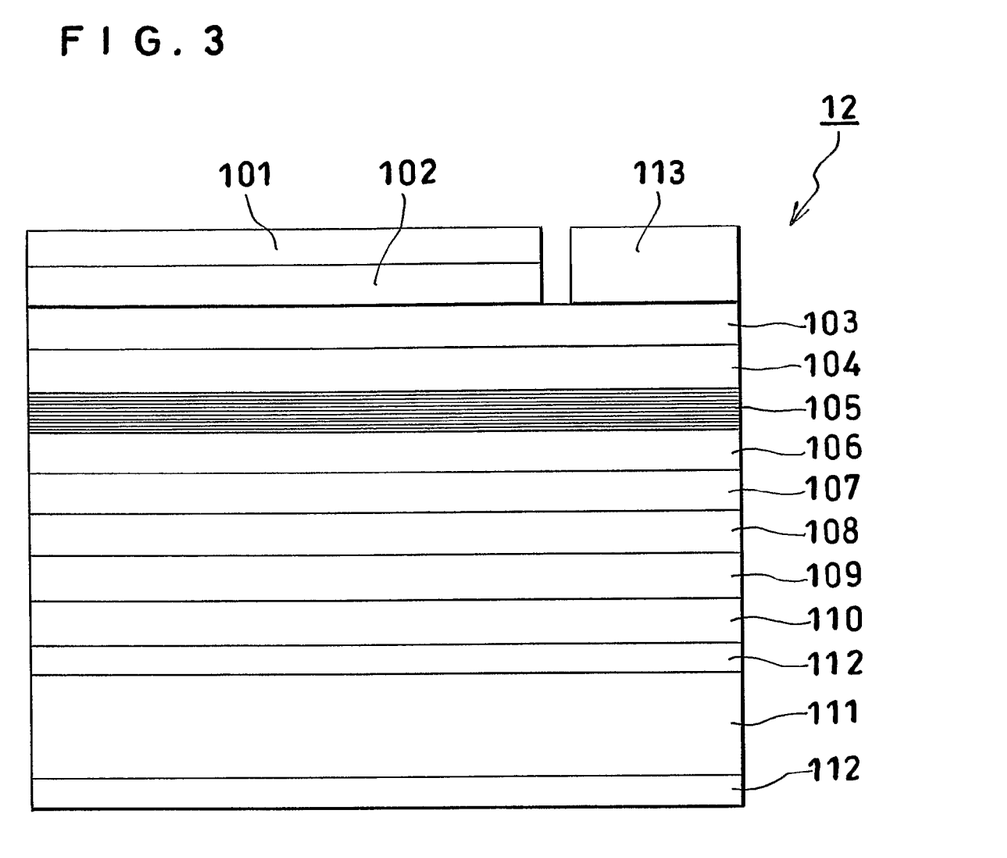
FIG. 3 is a schematic cross section showing the structure of an LED according to the present invention obtained by chipping the stacked structure shown in FIG. 1.
Figure 4:
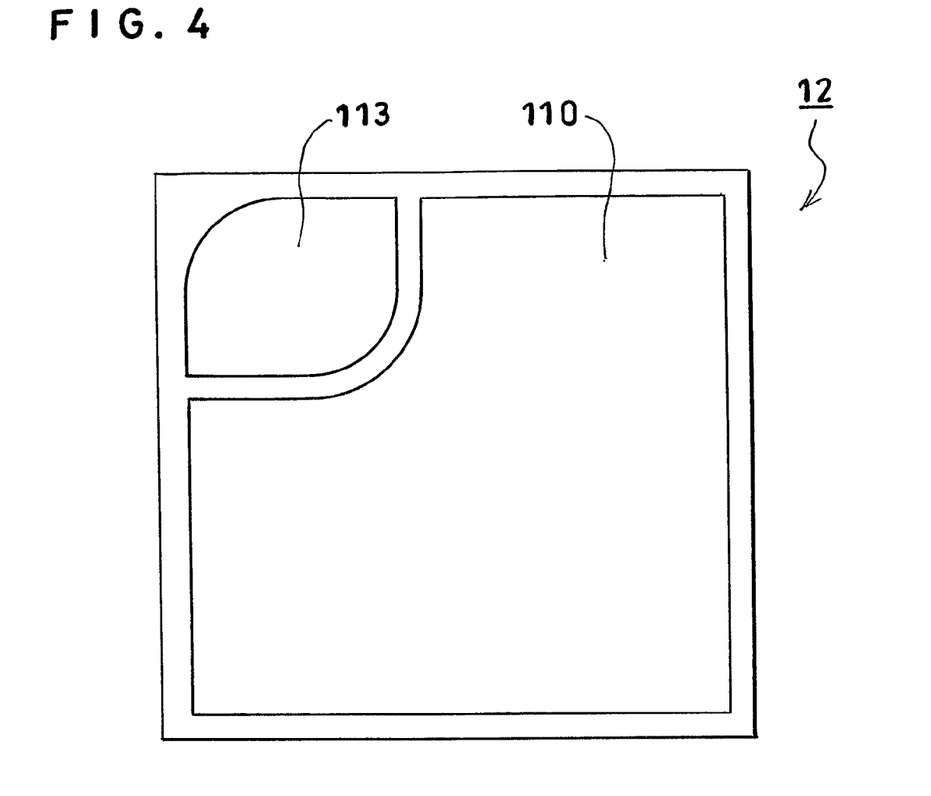
FIG. 4 is a plan view of the LED.
Figure 5:
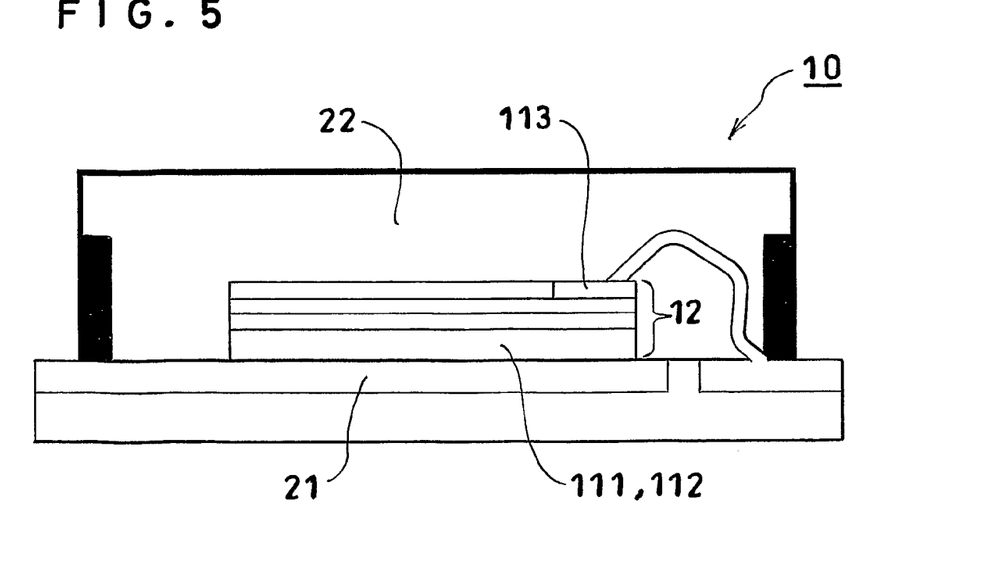
FIG. 5 is a sectional view of an LED lamp formed by mounting the LED.

FIG. 1 is a schematic cross section showing the structure of the stacked structure formed on a sapphire substrate. FIG. 2 shows a structure on the side of the plate body. FIG. 3 is a schematic cross section showing the structure of an LED according to the present invention obtained by chipping the stacked structure shown in FIG. 1. FIG. 4 is a plan view of the LED. FIG. 5 is a sectional view of an LED lamp formed by mounting the LED.

First, as shown in FIG. 1, an aluminum nitride (AlN) layer 101 was formed on a (0001) crystal face of an electric insulating sapphire substrate 100 about 350 μm in thickness using seeding process (SP) means by means of the ordinary pressure-reduced MOCVD method at 900° C. The thickness of the AlN layer 101 was 5 nm. A buffer layer 102 of gallium nitride (GaN) having thickness of 18 nm was formed on the AlN layer 101 at 1050° C.

An n-type contact layer 103 of n-type aluminum gallium nitride mixed crystal ($Al_{0.01}Ga_{0.99}N$) having an aluminum composition ratio of 0.01 was formed on the GaN buffer layer 102 so that the atom concentration of silicon (Si) in the layer became $1 \times 10^{18}$ cm$^3$. The contact layer 103 was allowed to grow at 1050° C. by the ordinary pressure-reduced MOCVD method. The thickness of the n-type contact layer 103 was set to about 2.5 μm.

An n-type clad layer 104 of n-type $Al_{0.10}Ga_{0.90}N$ was stacked on the n-type $Al_{0.01}Ga_{0.99}N$ contact layer 103. The n-type clad layer 104 was formed by doping so that the atom concentration of Si in the layer became $1 \times 10^{18}$ cm$^{-3}$. The thickness of the n-type clad layer 104 formed by the ordinary pressure-reduced MOCVD method was set to about 0.5 μm.

An n-type light-emitting layer 105 comprising a barrier layer of n-type $Al_XGa_YN$ and a well layer of n-type $Ga_YIn_ZN$ was stacked on the n-type $Al_{0.10}Ga_{0.90}N$ clad layer 104. The composition ratio (=Z) of indium (In) in the well layer was adjusted so that ultraviolet light having wavelength of 360 nm to 370 nm could be emitted from the quantum well structure. The quantum well structure was formed, with the thickness of the well layer set to about 5 nm and the thickness of the barrier layer set to 15 nm.

A p-type $Al_{X1}Ga_{Y1}N$ clad layer 106 intentionally doped with p-type Mg impurities and having thickness of 2.5 nm was formed on the quantum well structure light-emitting layer 105. The aluminum composition ratio (=X1) in the layer 106 was set to about 0.10 (=10%). The Mg was doped so that the atom concentration in the layer 106 became $5 \times 10^{18}$ cm$^{-3}$. A p-type contact layer 107 of $Al_{X2}Ga_{Y2}N$ (X1>X2≧0) doped with Mg and having a smaller composition ratio of Al was formed on the p-type clad layer 106. The atom concentration of Mg in the contact layer 107 was set to about $2 \times 10^{19}$ cm$^{-3}$.

A thin film of platinum (Pt) was formed on the surface of the p-type contact layer 107 as a p-type ohmic electrode film 108 by the ordinary high frequency sputtering means. On the p-type ohmic electrode film was provided a metal reflection film 109 for reflecting light from the multi-quantum well structure light-emitting layer 105 toward the crystal substrate 100. The metal reflection film 109 was made from rhodium (Rh) coated film.

Next, the back surface of the sapphire substrate 100 which mechanically supported thereon the stacked structure 11 was ground. The back surface of the sapphire substrate 100 was polished to have a thickness of 130 μm to 150 μm using colloidal silica containing fine silicon oxide particles having an average particle diameter of 0.5 μm. With this polishing, the thickness of the sapphire substrate 100 was thinned to 210±10 μm.

After the sapphire substrate 100 was polished, on the metal reflection film 109 was formed eutectic film 110 of gold-germanium (Au—Ge) whose p-type conductive plane orientation was (100) for bonding the Si monocrystal plate 111 (FIG. 2). Then, the p-type (100)-Si monocrystal plate 111 having a thickness of about 350 μm and the Au—Ge film 110 provided on the side of the stacked structure were bonded while being heated to about 500° C. At that time of the bonding, the <110> crystal orientation of the (100)-Si monocrystal plate 111 was substantially aligned with [1.1.-2.0.] crystal orientation of the (0001)-sapphire substrate 100. With this, the stacked structure 11 was mechanically supported on the bonded Si monocrystal plate 111.

Then, the junction interface between the sapphire substrate 100 and the AlN buffer layer 101 was radiated with excimer laser beams having wavelength of 248 nm from the back surface of the sapphire substrate 100 (surface of the substrate opposite from the surface on which the stacked structure was formed) which was polished and thinned. With this, since thermal expansion coefficients of the sapphire substrate 100 and the stacked structure 11 are different, the thinned sapphire substrate 100 was lifted off the stacked structure 11 from the portions of the AlN buffer layer 101 and the GaN buffer layer 102.

Next, the surface of the Si monocrystal plate 111 was polished using colloidal silica containing silicon oxide powder having average particle diameter of about 0.5 μm to a flat mirror surface and then, a p-type ohmic electrode 112 of gold (Au) film was formed on the entire surface of the p-type Si monocrystal plate 111 having the thickness reduced to 70 μm (FIG. 2).

Then, the known photolithography was utilized to subject photoresist material to selective patterning to expose a surface of n-type contact layer 103 that was limited to a region where an n-type ohmic electrode 113 was to be formed. Next, the ordinary high-frequency plasma etching means was utilized to selectively etch only the region of a chip-like corner which was subjected to the patterning to expose the corner surface of the n-type contact layer 103.

Then, the ordinary vacuum deposition means and electron beam deposition means were used together to form on the exposed corner surface of the n-type contact layer 103 an n-type ohmic electrode 113 having a multi-layer structure of three metal layers of chromium (Cr), titanium (Ti) and gold (Au), with the chromium layer in contact with the n-type contact layer 103 (FIG. 3).

Next, the ordinary laser scribe method was used to form division grooves for dividing the device in the Si monocrystal plate 111 side. The ordinary breaker was used to apply mechanical pressure to the grooves, thereby dividing the device into individual Group III nitride semiconductor light-emitting devices (chips) 12 of the shape of a substantial square in a plan view having one side length of about 350 μm. With this, a Group III nitride semiconductor LED 12 (FIGS. 3 and 4) of pn junction type DH structure was completed, with the sapphire substrate 100 removed and the stacked structure 11 mechanically supported on the plate body (Si monocrystal plate) 111 bonded on the stacked structure 11.

Then, the p-type ohmic electrode 112 provided on the surface of the plate body 111 bonded onto the stacked structure 11 was mounted on a lead frame 21 using conductive paste. To the n-type ohmic electrode 113 provided on the n-type contact layer 103 exposed in consequence of the lifted-off sapphire substrate 100 a wire was bonded to form a circuit capable of flowing device driving current between the ohmic electrodes 112 and 113. As described above, since the surface of the n-type ohmic electrode 113 was of gold (Au) film, they could readily be bonded. Then, the device was sealed with epoxy resin 22 containing an inhibitor for preventing deterioration by ultraviolet light to complete a light-emitting diode (LED) lamp 10.

Since the LED 12 utilized the wide surface of plate body 111 bonded thereto to provide the ohmic electrode 112 of one polarity (p-type in this embodiment) over the entire surface, it can disperse the device driving current two dimensionally in the wide region of the light-emitting layer 105. Since the device driving current could thus be dispersed, it was possible to obtain an LED having an increased light-emitting region and a strong emission output. When device driving current of 20 mA was allowed to flow through the LED 12 to emit light, the emission output reached about 6 mW with respect to ultraviolet light having a wavelength of about 370 nm. The forward voltage (Vf), when forward current of 20 mA was allowed to flow, was as low as about 3.4 V.

The LED 12 was formed using an Si monocrystal plate having excellent conductivity and thermal conductivity as the plate body 111. Thus, the radiation of the light-emitting device chip was also improved. Thus, even when the forward current used was as high as 50 mA or more, the change in light-emitting characteristics, such as emission wavelength and forward voltage, with elapse of time could not recognized almost at all. Since the Si monocrystal plate 111 was bonded along the specific crystal orientation of the sapphire substrate 100, no crack which might be caused by thermal stress was generated in the stacked structure though large current of 50 mA was allowed to flow continuously in the forward direction over a long period of 72 hours.

INDUSTRIAL APPLICABILITY

According to the LED having the aforementioned structure, since the p-type ohmic electrode provided on the conductive plate body bonded on the stacked structure is electrically connected to the circuit described above, the wire bonding was required only for the n-type ohmic electrode. Thus, an LED lamp could be produced with excellent productivity. Further, this lamp has excellent discharging properties and electrostatic blocking voltage because the insulation sapphire substrate has completely been lifted off.

The invention claimed is:

1. A Group III nitride semiconductor light-emitting device comprising:
   a stacked structure formed on a crystal substrate, removable from the stacked structure, and including two Group III nitride semiconductor layers having different electric conductive types and a light-emitting layer which is stacked between the two Group III nitride semiconductor layers and which comprises a Group III nitride semiconductor; and
   a plate body made of material different from that of the crystal substrate and formed on a surface of an uppermost layer which is opposite from the crystal substrate that is removable from the stacked structure,
   wherein the crystal substrate is a sapphire substrate having a (0001) face on which the stacked structure is formed, the plate body is a conductive (001)-Si monocrystal, and
   wherein the plate body has a <110> crystal orientation that is in parallel to a [1.1.-2.0] crystal orientation of the (0001)-sapphire substrate.

2. The Group III nitride semiconductor light-emitting device according to claim 1, wherein the plate body is made of conductive material.

3. The Group III nitride semiconductor light-emitting device according to claim 1, wherein the crystal substrate is removed from the stacked structure by irradiating laser beams onto a junction interface region between the stacked structure and the crystal substrate.

4. The Group III nitride semiconductor light-emitting device according to claim 1, further comprising an ohmic electrode provided on the plate body.

5. The Group III nitride semiconductor light-emitting device according to claim 1, wherein the plate body is formed on the surface of the uppermost layer through a metal layer.

6. The Group III nitride semiconductor light-emitting device according to claim 5, wherein the metal layer comprises eutectic metal film.

7. The Group III nitride semiconductor light-emitting device according to claim 1, further comprising a metal reflection film for reflecting light from the light-emitting layer provided between the plate body and the surface of the uppermost layer.

8. A method of producing a Group III nitride semiconductor light-emitting device comprising:
   a stacked structure formed on a crystal substrate removable from the stacked structure, and including two Group III nitride semiconductor layers having different electric conductive types and a light-emitting layer which is stacked between the two Group III nitride semiconductor layers and which comprises a Group III nitride semiconductor; and
   a plate body made of material different from that of the crystal substrate and formed on a surface of an uppermost layer which is opposite from the crystal substrate that is removable from the stacked structure,
   wherein the crystal substrate is a sapphire substrate having a (0001) face on which the stacked structure is formed, the plate body is a conductive (001)-Si monocrystal, and
   wherein the plate body has a <110> crystal orientation that is in parallel to a [1.1.-2.0] crystal orientation of the (0001)-sapphire substrate,
   said method comprising the steps of:
   forming on a crystal substrate to be removed a stacked structure including two Group III nitride semiconductor layers having different electric conductive types and a light-emitting layer which is stacked between the two Group III nitride semiconductor layers and which comprises a Group III nitride semiconductor;
   forming a plate body made of material different from that of the crystal substrate on a surface of an uppermost layer which is opposite from the crystal substrate; and
   removing the crystal substrate.

* * * * *